US012805404B2

(12) United States Patent
Murakami et al.

(10) Patent No.: US 12,805,404 B2
(45) Date of Patent: Nov. 17, 2026

(54) LIGHT EMITTING MODULE

(71) Applicant: NICHIA CORPORATION, Anan (JP)

(72) Inventors: Yuichiro Murakami, Tokushima (JP); Tsuyoki Shimizu, Tokushima (JP); Noriyuki Sato, Tokushima (JP); Shigeharu Yamauchi, Katsuura-gun (JP); Tomotake Tanaka, Anan (JP)

(73) Assignee: NICHIA CORPORATION, Anan (JP)

( * ) Notice: Subject to any disclaimer, the term of this patent is extended or adjusted under 35 U.S.C. 154(b) by 399 days.

(21) Appl. No.: 18/538,334

(22) Filed: Dec. 13, 2023

(65) Prior Publication Data

US 2024/0203954 A1 Jun. 20, 2024

(30) Foreign Application Priority Data

Dec. 16, 2022 (JP) ................................ 2022-201164
Nov. 10, 2023 (JP) ................................ 2023-191969

(51) Int. Cl.
*H10W 90/00* (2026.01)
*H10H 20/857* (2025.01)

(52) U.S. Cl.
CPC .......... *H10W 90/00* (2026.01); *H10H 20/857* (2025.01)

(58) Field of Classification Search
None
See application file for complete search history.

(56) References Cited

U.S. PATENT DOCUMENTS

| | | | | |
|---|---|---|---|---|
| 4,500,914 A * | 2/1985 | Watanabe | ............ | H04N 25/134 348/E9.01 |
| 2007/0008740 A1 | 1/2007 | Lee et al. | | |
| 2007/0159851 A1 | 7/2007 | Lee et al. | | |
| 2016/0131313 A1 | 5/2016 | Miwa et al. | | |
| 2017/0215958 A1 | 8/2017 | Beerwerth et al. | | |
| 2017/0215959 A1 | 8/2017 | Beerwerth et al. | | |
| 2017/0215960 A1 | 8/2017 | Beerwerth et al. | | |
| 2017/0216619 A1 | 8/2017 | Beerwerth et al. | | |
| 2022/0050380 A1 | 2/2022 | Sievers et al. | | |

FOREIGN PATENT DOCUMENTS

| | | |
|---|---|---|
| JP | 2007027731 A | 2/2007 |
| JP | 2007188885 A | 7/2007 |
| JP | 2015165456 A | 9/2015 |
| JP | 2015176690 A | 10/2015 |
| JP | 2016092373 A | 5/2016 |
| JP | 2021006278 A | 1/2021 |
| JP | 2021007780 A | 1/2021 |
| JP | 2021529113 A | 10/2021 |

* cited by examiner

*Primary Examiner* — Bo B Jang
(74) *Attorney, Agent, or Firm* — Hunton Andrews Kurth LLP

(57) ABSTRACT

A light emitting module includes a plurality of light sources arranged in a first direction and a second direction and disposed at grid points in a top view. The plurality of light sources are arranged in a plurality of light source arrays and include a plurality of first light sources configured to emit light having a first peak wavelength, a plurality of second light sources configured to emit light having a second peak wavelength longer than the first peak wavelength, and a plurality of third light sources configured to emit light having a third peak wavelength longer than the second peak wavelength. In each of the light source arrays, two or more first light sources, two or more second light sources, and one or more third light sources are arranged in the first direction and connected in series.

15 Claims, 14 Drawing Sheets

LIGHT EMITTING MODULE

CROSS-REFERENCE TO RELATED APPLICATIONS

This application is based on and claims priority to Japanese Patent Application No. 2022-201164, filed on Dec. 16, 2022, and Japanese Patent Application No. 2023-191969, filed on Nov. 10, 2023, the entire contents of which are incorporated herein by reference.

TECHNICAL FIELD

The disclosure herein relates to a light emitting module.

BACKGROUND

Light emitting modules including light emitting devices that emit light with a plurality of wavelengths, and irradiating an object with the light from the light emitting devices are known.

Japanese Laid-open Patent Publication No. 2016-092373 describes a configuration in which, in order to prevent the occurrence of light emission unevenness when a plurality of ultraviolet light LED chips or a plurality of violet LED chips and a plurality of blue LED chips are connected in series and parallel to each other, four LED strings are connected in parallel, in each of which three ultraviolet light LED chips and three blue LED chips are connected in series, and the number of the ultraviolet light LED chips and the number of the blue LED chips are the same for each of the LED strings.

SUMMARY

A light emitting module is required to reduce illuminance unevenness in an irradiation region.

According to an embodiment of the present disclosure, it is desirable to provide a light emitting module that can reduce illuminance unevenness in an irradiation region.

A light emitting module according to an embodiment of the present disclosure includes a plurality of light sources arranged in a first direction and a second direction and disposed at grid points in a top view. The second direction is orthogonal to the first direction. The plurality of light sources are arranged in a plurality of light source arrays and include a plurality of first light sources configured to emit light having a first peak wavelength, a plurality of second light sources configured to emit light having a second peak wavelength longer than the first peak wavelength, and a plurality of third light sources configured to emit light having a third peak wavelength longer than the second peak wavelength. In each of the light source arrays, two or more first light sources, two or more second light sources, and one or more third light sources are arranged in the first direction and connected in series. The number of the plurality of first light sources included in the plurality of light sources is greater than the number of the plurality of second light sources included in the plurality of light sources. The number of the plurality of second light sources included in the plurality of light sources is greater than the number of the plurality of third light sources included in the plurality of light sources. An output per unit power of the plurality of third light sources is higher than an output per unit power of the plurality of second light sources. The output per unit power of the plurality of second light sources is higher than an output per unit power of the plurality of first light sources. At least some of the plurality of first light sources or at least some of the plurality of second light sources are disposed at positions adjacent to the plurality of third light sources in the first direction and the second direction.

A light emitting module according to an embodiment of the present disclosure includes a plurality of light sources arranged in a first direction and a second direction in a top view. The second direction is orthogonal to the first direction. The plurality of light sources are arranged in a plurality of light source arrays and include a plurality of first light sources configured to emit light having a first peak wavelength, a plurality of second light sources configured to emit light having a second peak wavelength longer than the first peak wavelength, and a plurality of third light sources configured to emit light having a third peak wavelength longer than the second peak wavelength. In each of the light source arrays, two or more first light sources, two or more second light sources, and one or more third light sources are arranged in the first direction and connected in series. A number of the plurality of first light sources included in the plurality of light sources is greater than a number of the plurality of second light sources included in the plurality of light sources. The number of the plurality of second light sources included in the plurality of light sources is greater than a number of the plurality of third light sources included in the plurality of light sources. An output per unit power of the plurality of third light sources is higher than an output per unit power of the plurality of second light sources. The output per unit power of the plurality of second light sources is higher than an output per unit power of the plurality of first light sources. At least some of the plurality of first light sources or at least some of the plurality of second light sources are disposed at positions adjacent to the plurality of third light sources in the first direction and the second direction. Some light sources, among light sources arranged in the second direction, are arranged such that positions in the first direction of the some light sources are the same in the top view.

A light emitting module according to an embodiment of the present disclosure includes a plurality of light sources arranged in a first direction and a second direction in a top view. The second direction is orthogonal to the first direction. The plurality of light sources are arranged in a plurality of light source arrays and include a plurality of first light sources configured to emit light having a first peak wavelength, and a plurality of third light sources configured to emit light having a third peak wavelength longer than the first peak wavelength. In each of the light source arrays, two or more first light sources and one or more third light sources are arranged in the first direction and connected in series. A number of the plurality of first light sources included in the plurality of light sources is greater than a number of the plurality of third light sources included in the plurality of light sources. An output per unit power of the plurality of third light sources is higher than an output per unit power of the plurality of first light sources. At least some of the plurality of first light sources are disposed at positions adjacent to the plurality of third light sources in the first direction and the second direction.

BRIEF DESCRIPTION OF THE DRAWINGS

Other objects and further features of the present invention will be apparent from the following detailed description when read in conjunction with the accompanying drawings, in which.

DETAILED DESCRIPTION

Figure 1:
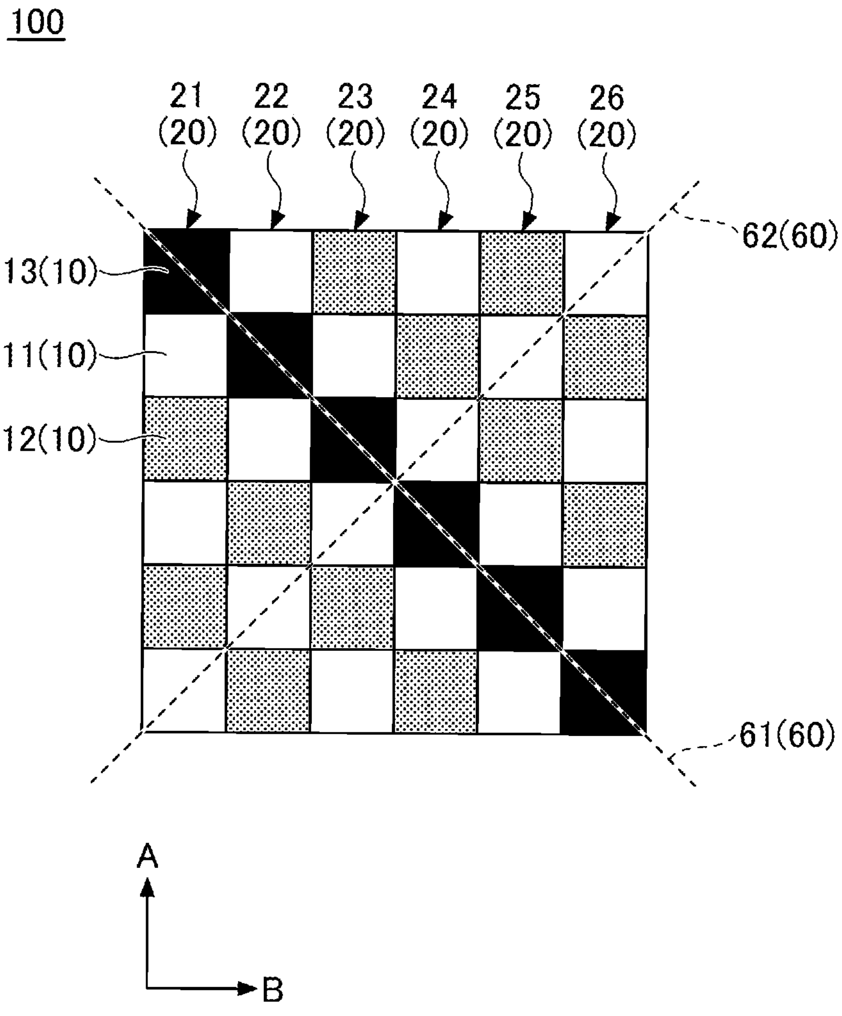
FIG. 1 is a schematic top view illustrating an example configuration of a light emitting module according to a first embodiment.

Light emitting modules according to embodiments of the present disclosure will be described in detail with reference to the accompanying drawings. The embodiments described below exemplify the light emitting modules to embody the technical idea of the embodiments, and are not limited to the following description. In addition, unless otherwise specified, the dimensions, materials, shapes, relative arrangements, and the like of components described in the embodiments are not intended to limit the scope of the present disclosure thereto, but are described as examples. The sizes, positional relationships, and the like of members illustrated in the drawings may be exaggerated for clearer illustration. Further, in the following description, the same names and reference numerals refer to the same or similar members, and a detailed description thereof will be omitted as appropriate.

First Embodiment

Figure 2:
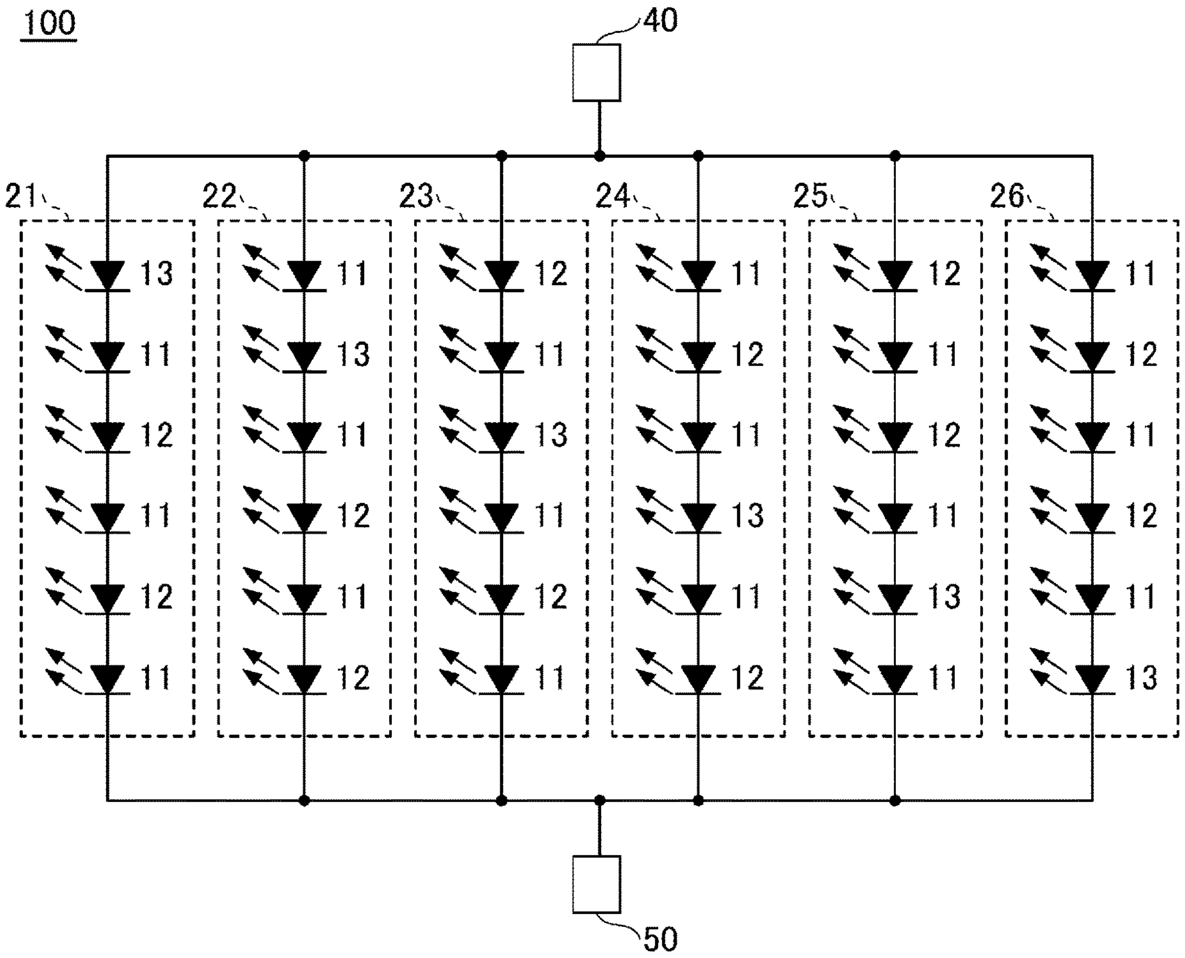
FIG. 2 is a diagram illustrating an example circuit configuration of the light emitting module according to the first embodiment.

A configuration of a light emitting module according to a first embodiment will be described with reference to FIG. 1 and FIG. 2. FIG. 1 is a schematic top view illustrating an example configuration of a light emitting module 100 according to the first embodiment. FIG. 2 is a diagram illustrating an example circuit configuration of the light emitting module 100.

In the present embodiment, the light emitting module 100 includes thirty-six light sources 10 arranged in a first direction A and a second direction B orthogonal to the first direction A and disposed at grid points in a top view.

As illustrated in FIG. 1 and FIG. 2, the thirty-six light sources 10 include eighteen first light sources 11, twelve second light sources 12, and six third light sources 13. According to the present embodiment, the number of the first light sources 11 included in the thirty-six light sources 10 is greater than the number of the second light sources 12 included in the thirty-six light sources 10. Further, the number of the second light sources 12 included in the thirty-six light sources 10 is greater than the number of the third light sources 13 included in the thirty-six light sources 10. The first light sources 11 are configured to emit light having a first peak wavelength. The second light sources 12 are configured to emit light having a second peak wavelength longer than the first peak wavelength. The third light sources 13 are configured to emit light having a third peak wavelength longer than the second peak wavelength.

In the example illustrated in FIG. 1, the first light sources 11 are indicated without hatching, the second light sources 12 are indicated by dot hatching, and the third light sources 13 are indicated in black. The number of the light sources 10 is not limited to thirty six, and can be appropriately changed according to the use or the like of the light emitting module 100, as long as the number of the light sources 10 is plural. The number of each of the first light sources 11, the second light sources 12, and the third light sources 13 can also be appropriately changed under the conditions that the number of the first light sources 11 is greater than the number of the second light sources 12 and the number of the second light sources 12 is greater than the number of the third light sources 13.

The thirty-six light sources 10 are arranged in six light source arrays 20. The six light source arrays 20 include light source arrays 21 to 26. The light source arrays 21 to 26 are connected in parallel between an anode-side electrode (positive-side electrode) 40 and a cathode-side electrode (negative-side electrode) 50. In each of the light source arrays 20, three first light sources 11, two second light sources 12, and one third light source 13 are arranged in the first direction A and connected in series.

Each of the thirty-six light sources 10 includes a light emitting element. As the light emitting element, for example, a light emitting diode (LED) can be used. For example, each of the light sources 10 can use an LED that emits ultraviolet light. The first peak wavelength of the first light sources 11 is, for example, 250 nm or more and 300 nm or less. The first peak wavelength is, for example, 280 nm. The second peak wavelength of the second light sources 12 is, for example, 300 nm or more and 350 nm or less. The second peak wavelength is, for example, 308 nm. The third peak wavelength of the third light sources 13 is, for example, 350 nm or more and 400 nm or less. The third peak wavelength is, for example, 365 nm. However, the peak wavelengths of the light emitted from the first light sources 11, the second light sources 12, and the third light sources 13 are not limited to those described above, and can be appropriately changed according to the use or the like of the light emitting module.

The thirty-six light sources 10 are disposed on a wiring substrate or the like. The wiring substrate may include a composite substrate (such as a glass epoxy substrate or a paper phenol substrate) of a synthetic resin material having high insulating properties (such as an epoxy resin or a phenol resin) and a base material (such as glass fibers or paper); a rectangular flat plate member formed of a ceramics material (such as aluminum nitride), or the like.

In the present embodiment, the output per unit power of the third light sources 13 is higher than the output per unit power of the second light sources 12. The output per unit power of the second light sources 12 is higher than the output per unit power of the first light sources 11. At least some of the first light sources 11 or at least some of the second light sources 12 are disposed at positions adjacent to the third light sources 13 in the first direction A and the second direction B.

In the present embodiment, the number of first light sources 11, the number of second light sources 12, and the number of third light sources 13 included in each of the light source arrays 20 may be the same. In the example illustrated in FIG. 1 and FIG. 2, the number of first light sources 11 included in one light source array 20 is three, the number of second light sources 12 included in one light source array 20 is two, and the number of third light sources 13 included in one light source array 20 is one. These numbers are the same for each of the light source arrays 21 to 26.

In the present embodiment, at least some of the first light sources 11 may be disposed at positions adjacent to the third light sources 13 in the first direction A and the second direction B. Further, at least some of the first light sources 11 may be disposed at positions adjacent to the second light sources 12 in the first direction A and the second direction B.

<Main Effects of Light Emitting Module 100>

In applications such as printing and exposure, light emitting modules that irradiate an object with light such as ultraviolet light while moving the object in order to cure the object are known. As such a light emitting module, a light emitting module using an LED that is smaller in size and lower in power consumption than a conventionally-used mercury lamp has been studied. In order to replace a mercury lamp that emits light having a plurality of peak wavelengths with an LED, a light emitting module is preferably configured to use a plurality of LEDs that can emit light having peak wavelengths different from each other. However, if the plurality of LEDs is used, illuminance unevenness would occur in an irradiation region due to a difference in light emission efficiency according to the peak wavelength of each of the LEDs. Therefore, the light emitting module is required to reduce illuminance unevenness in the irradiation region when irradiating an object with light while moving the object in the first direction A or the second direction B. As used herein, the term "irradiation region" refers to a region to which light is emitted from the light emitting module.

In the present embodiment, the thirty-six light sources 10 (plurality of light sources) are arranged in the first direction A and the second direction B and disposed at the grid points in a top view. The thirty-six light sources 10 are arranged in the six light source arrays 20 (plurality of light source arrays) and include the first light sources 11 (plurality of first light sources) configured to emit the light having the first peak wavelength, the second light sources 12 (plurality of second light sources) configured to emit the light having the second peak wavelength longer than the first peak wavelength, and the third light sources 13 (plurality of third light source) configured to emit the light having the third peak wavelength longer than the second peak wavelength. In each of the six light source arrays 20, three first light sources 11 (two or more first light sources), two second light sources 12 (two or more second light sources), and one third light source 13 (one or more third light sources) are arranged in the first direction A and connected in series. The number of the first light sources 11 included in the thirty-six light sources is greater than the number of the second light sources 12 included in the thirty-six light sources. The number of the second light sources 12 included in the thirty-six light sources is greater than the number of the third light sources 13 included in the thirty-six light sources. The output per unit power of the third light sources 13 is higher than the output per unit power of the second light sources 12. The output per unit power of the second light sources 12 is higher than the output per unit power of the first light sources 11. At least some of the first light sources 11 or at least some of the second light sources 12 are disposed at positions adjacent to the third light sources 13 in the first direction A and the second direction B. For example, at least some of the first light sources 11 are disposed at positions adjacent to the third light sources 13 in the first direction A and the second direction B. Alternatively, at least some of the first light sources 11 are disposed at positions adjacent to the second light sources 12 in the first direction A and the second direction B.

In the present embodiment, the number of the first light sources 11, whose output per unit power is lower than that of the second light sources 12, is greater than the number of the second light sources 12. In addition, the number of the second light sources 12, whose output per unit power is lower than that of the third light sources 13, is greater than the number of the third light sources 13. Accordingly, the illuminance of the light having the first peak wavelength, the illuminance of the light having the second peak wavelength, and the illuminance of the light having the third peak wavelength can be made to be close to each other. In addition, by disposing at least some of the first light sources 11 or at least some of the second light sources 12 at positions adjacent to the third light sources 13 in the first direction A and the second direction B, even if the number of the third light sources 13 is smaller than the number of the first light sources 11 and the number of the second light sources 12, the light having the third peak wavelength is easily emitted in a wide range from the third light sources 13. Further, the third light sources 13 having a high output per unit power are not disposed adjacent to each other in the first direction A and the second direction B, and thus, output imbalances in the light emitting module are easily reduced. Accordingly, in the present embodiment, the light emitting module that can reduce illuminance unevenness in the irradiation region can be provided.

In the present embodiment, as illustrated in FIG. 1, the third light sources 13 may be located on one of two diagonal lines 60 of a grid defined by the plurality of light sources 10 in a top view. By disposing the third light sources 13 having a high output in the diagonal direction, a desired output can be ensured in the light emitting module 100 even when the number of the third light sources 13 is smaller than the number of the first light sources 11 and the number of the second light sources 12. Accordingly, in the present embodiment, illuminance unevenness in wavelengths in the irradiation region can be reduced.

In the present embodiment, the two diagonal lines 60 are a first diagonal line 61 and a second diagonal line 62. The third light sources 13 are aligned on the first diagonal line 61. The first light sources 11 and the second light sources 12 may be arranged in a direction parallel to the first diagonal line 61. At least some of the eighteen first light sources 11 may be located between corresponding second light sources 12 and the third light sources 13 in one or both of a direction parallel to the first direction A and a direction parallel to the second direction B. In the example illustrated in FIG. 1, among the eighteen first light sources 11, first light sources 11 adjacent to the third light sources 13 are located between corresponding second light sources 12 and the third light sources 13 in one or both of the direction parallel to the first direction A and the direction parallel to the second direction B. With this configuration, a large number of first light sources 11 having an output lower than that of the second light sources 12 can be disposed. Accordingly, in the present embodiment, illuminance unevenness in wavelengths in the irradiation region can be reduced.

In the present embodiment, the number of first light sources 11, the number of second light sources 12, and the number of third light sources 13 included in each of the six light source arrays 20 (in each of the light source arrays) are the same. With this configuration, the drive voltages of the six light source arrays 20 can be made substantially the same. Accordingly, illuminance unevenness in the irradiation region can be reduced.

In the present embodiment, a difference between the first peak wavelength and the second peak wavelength may be smaller than a difference between the second peak wavelength and the third peak wavelength. With this configuration, in the present embodiment, light having a high emission intensity can be emitted over a long distance in the diagonal direction. Accordingly, illuminance unevenness in the irradiation region can be reduced.

Second Embodiment

Next, a light emitting module according to a second embodiment will be described. The same names and reference numerals as those of the above-described embodiment and a modification thereof refer to the same or similar members, and a detailed description thereof will be omitted as appropriate. The same applies to embodiments as will be described later.

The second embodiment differs from the first embodiment mainly in that third light sources are not aligned on either of two diagonal lines of a grid defined by a plurality of light sources in a top view.

Figure 3:
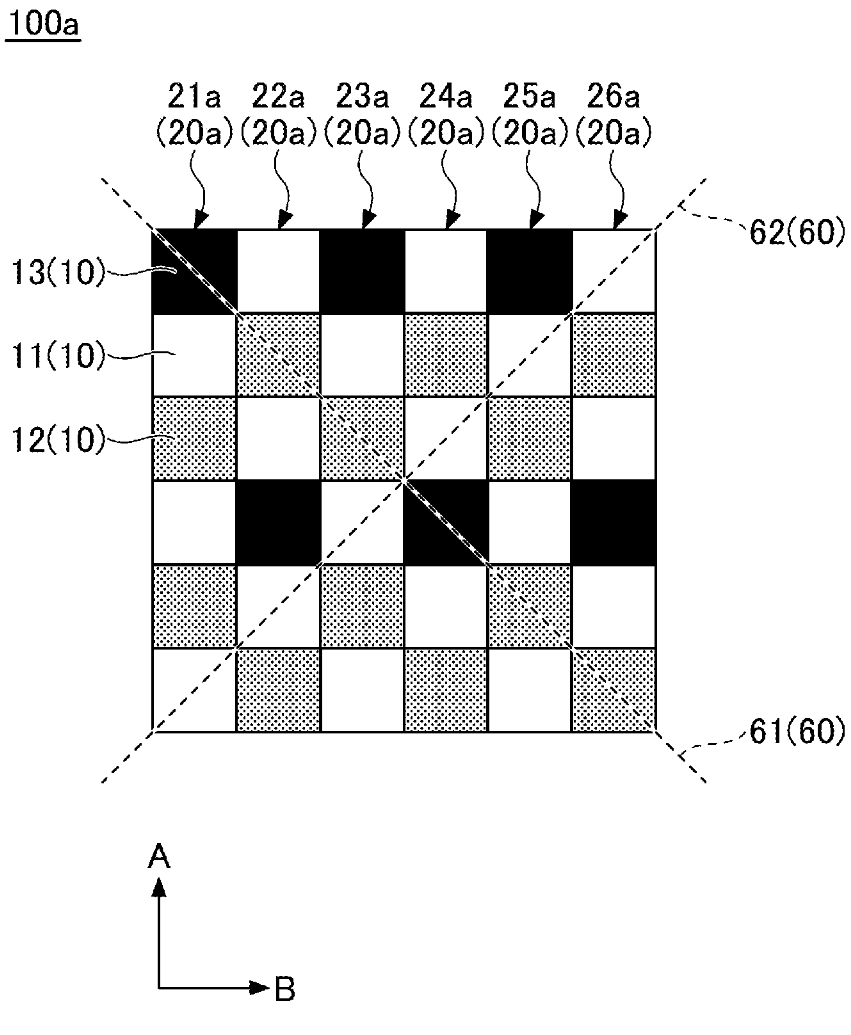
FIG. 3 is a schematic top view illustrating an example configuration of a light emitting module according to a second embodiment.
Figure 4:
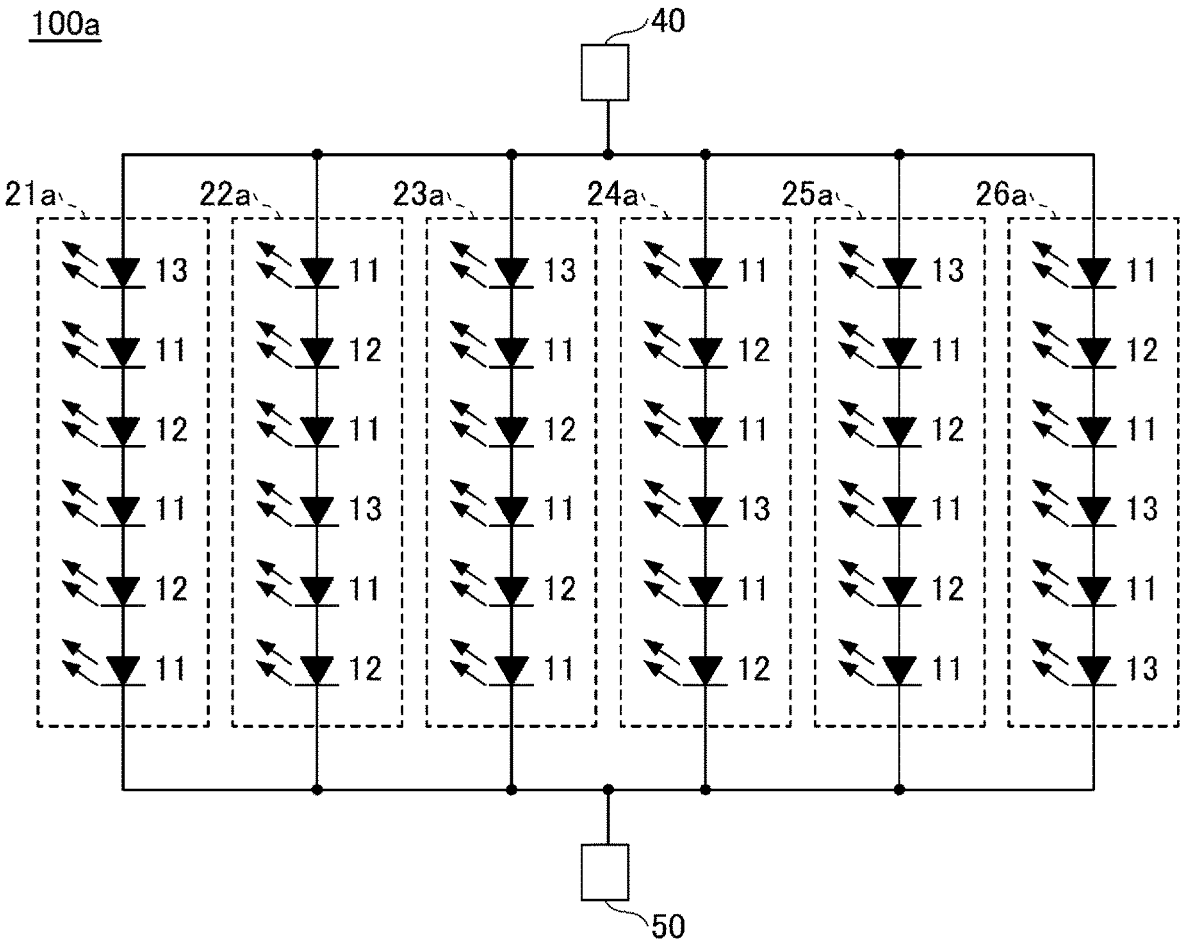
FIG. 4 is a diagram illustrating an example circuit configuration of the light emitting module according to the second embodiment.

FIG. 3 is a schematic top view illustrating an example configuration of a light emitting module 100*a* according to the second embodiment. FIG. 4 is a diagram illustrating an example circuit configuration of the light emitting module 100*a*.

The light emitting module 100*a* differs from the light emitting module 100 according to the first embodiment in that the light emitting module 100*a* has six light source arrays 20*a*. The six light source arrays 20*a* include light source arrays 21*a* to 26*a*. In the present embodiment, none of six third light sources 13 included in the light source arrays 21*a* to 26*a* is located on a second diagonal line 62 of two diagonal lines 60 of a grid defined by thirty-six light sources 10 in a top view.

In the present embodiment, the two diagonal lines 60 are a first diagonal line 61 and the second diagonal line 62. Some of the six third light sources 13 are located on the first diagonal line 61. In FIG. 3, two third light sources 13 are located on the first diagonal line 61. First light sources 11 and second light sources 12 are not alternately arranged in a direction parallel to the first diagonal line 61. Further, none of the eighteen first light sources 11 is located between a second light source 12 and a third light source 13 in a direction parallel to the second direction B. At least some of the eighteen first light sources 11 are located between the second light sources 12 or between the third light sources 13 in the direction parallel to the second direction B.

The above-described light emitting module 100*a* can obtain substantially the same effects as those of the light emitting module 100 when irradiating an object with light while moving the object along the first direction A. In other words, substantially the same effects as those of the light emitting module 100 can be obtained even in a configuration in which the third light sources 13 are not necessarily aligned on either the first diagonal line 61 or the second diagonal line 62.

Third Embodiment

Next, a light emitting module according to a third embodiment will be described. The third embodiment differs from the first embodiment mainly in that the number of light sources included in the light emitting module.

Figure 5:
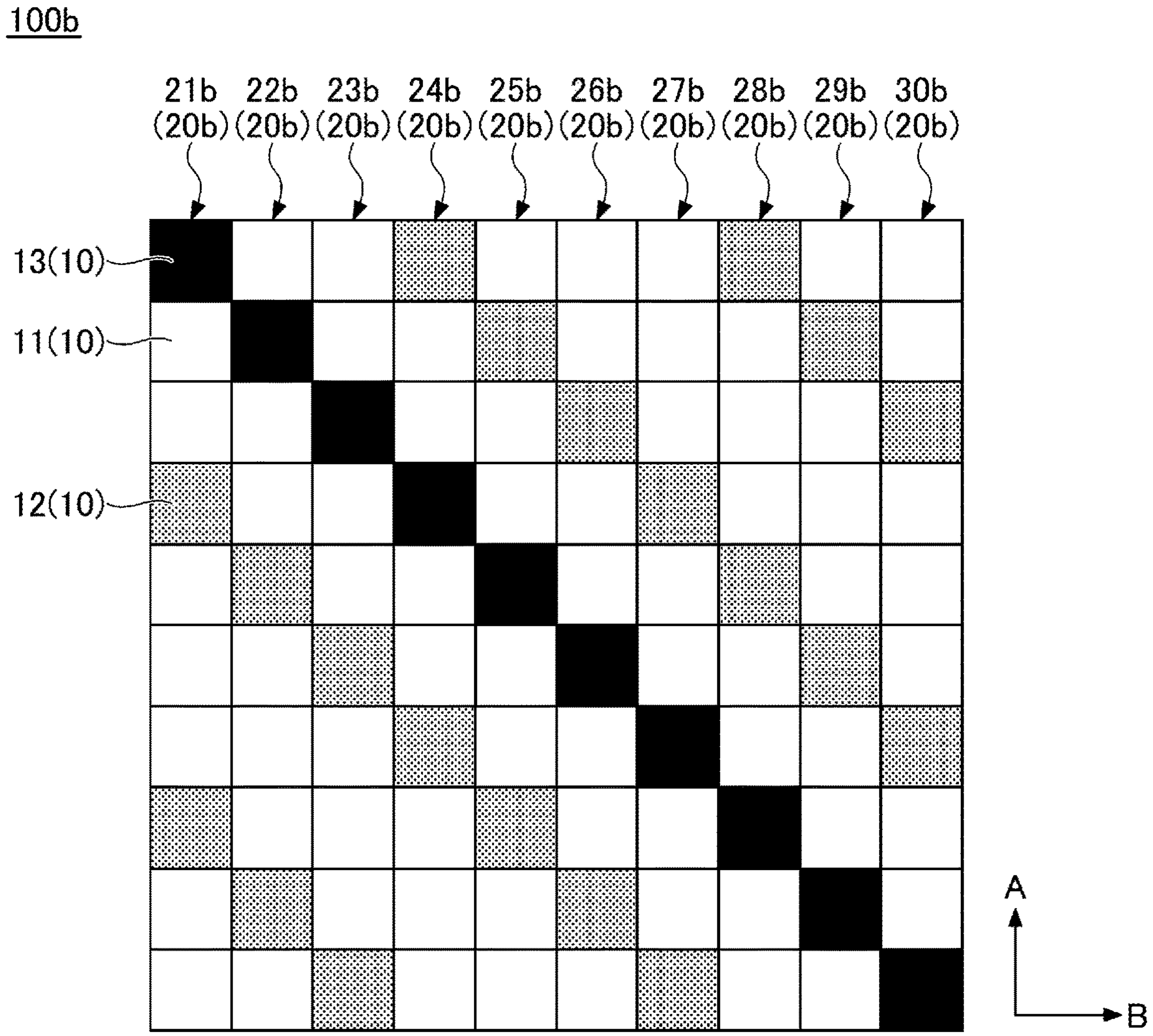
FIG. 5 is a schematic top view illustrating a light emitting module according to a third embodiment.
Figure 6:
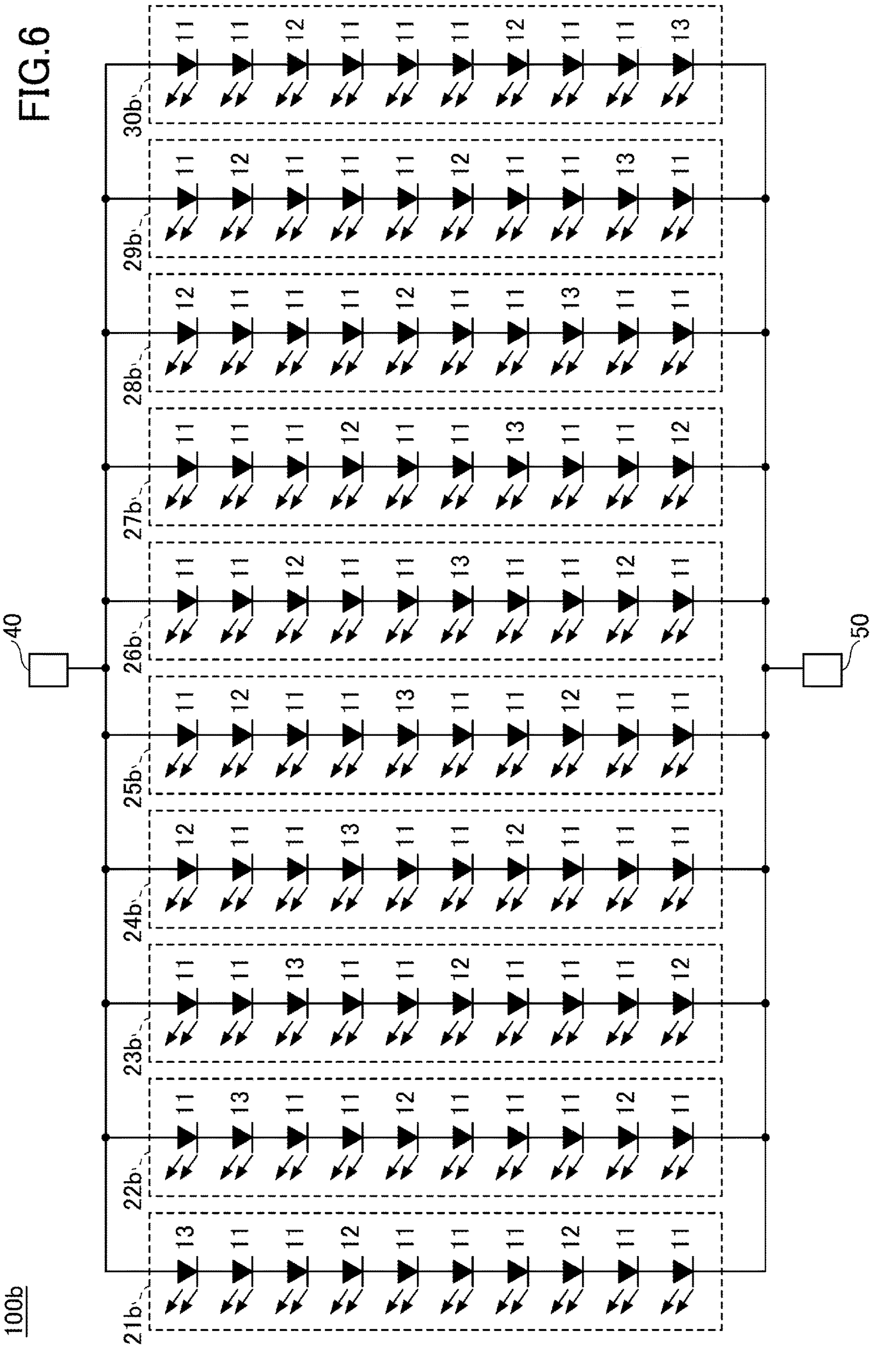
FIG. 6 is a diagram illustrating an example circuit configuration of the light emitting module according to the third embodiment.

FIG. 5 is a schematic top view illustrating a light emitting module 100*b* according to the third embodiment. FIG. 6 is a diagram illustrating an example circuit configuration of the light emitting module 100*b*.

The light emitting module 100*b* differs from the light emitting module 100 according to the first embodiment in that the light emitting module 100*b* includes a hundred light sources 10 arranged in the first direction A and the second direction B and disposed at grid points in a top view as illustrated in FIG. 5 and FIG. 6. In addition, the light emitting module 100*b* differs from the light emitting module 100 in that the light emitting module 100*b* has ten light source arrays 20*b* including light source arrays 21*b* to 30*b*.

In the present embodiment, a plurality of first light sources 11 are arranged between second light sources 12 and arranged between second light sources 12 and third light sources 13 in the first direction A and the second direction B. With this configuration, a large number of first light sources 11 having an output lower than that of the second light sources 12 can be disposed. Accordingly, in the present embodiment, illuminance unevenness in wavelengths in the irradiation region can be further reduced.

The above-described light emitting module 100*b* can obtain substantially the same effects as those of the light emitting module 100. In other words, substantially the same effects as those of the light emitting module 100 can be obtained even when the number of light sources 10 is changed as appropriate.

Fourth Embodiment

Next, a light emitting module according to a fourth embodiment will be described. The fourth embodiment differs from the first embodiment mainly in that a plurality of light sources includes a plurality of fourth light sources configured to emit light having a fourth peak wavelength that is longer than the second peak wavelength and shorter than the third peak wavelength.

Figure 7:
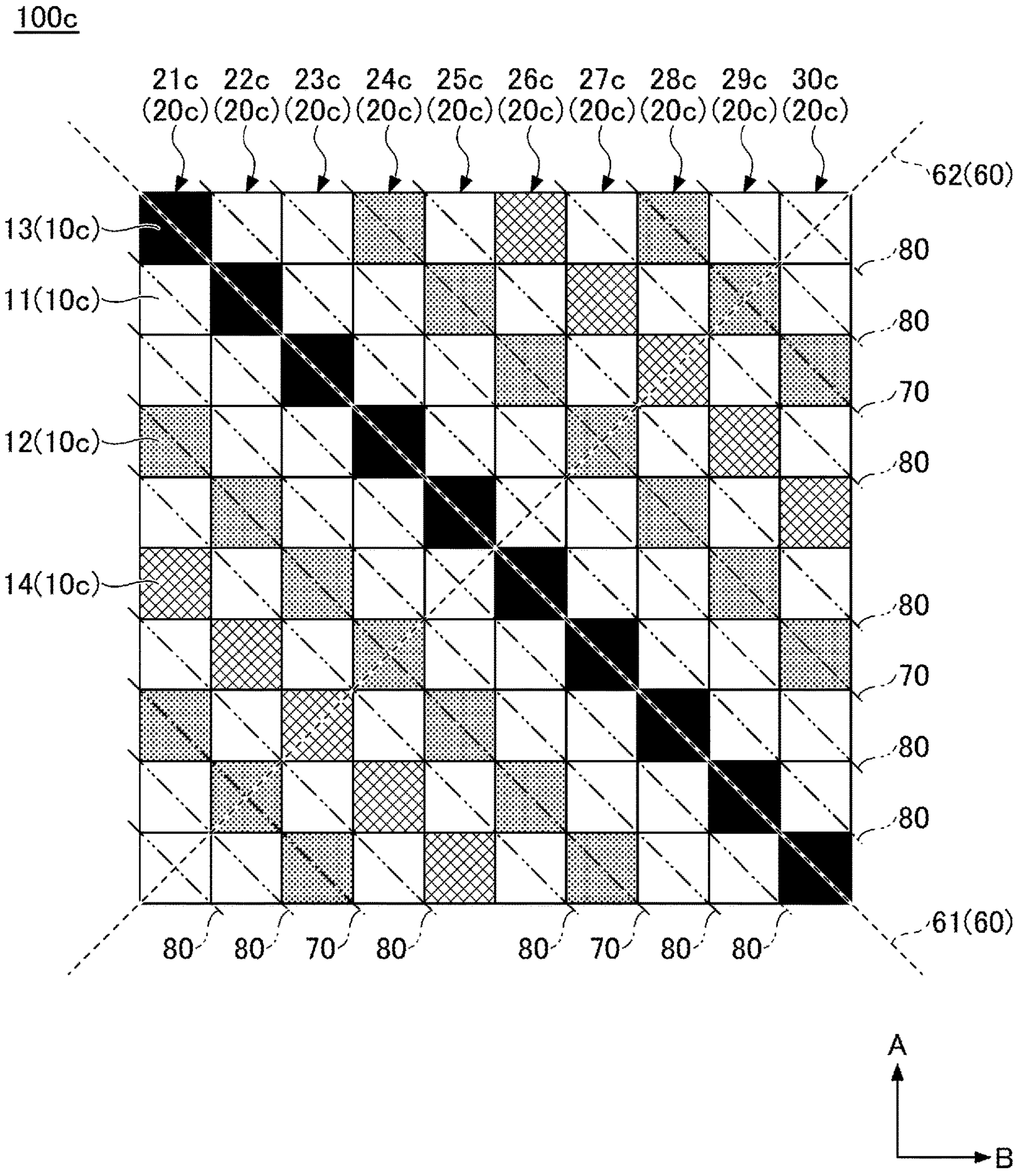
FIG. 7 is a schematic top view illustrating an example configuration of a light emitting module according to a fourth embodiment.
Figure 8:
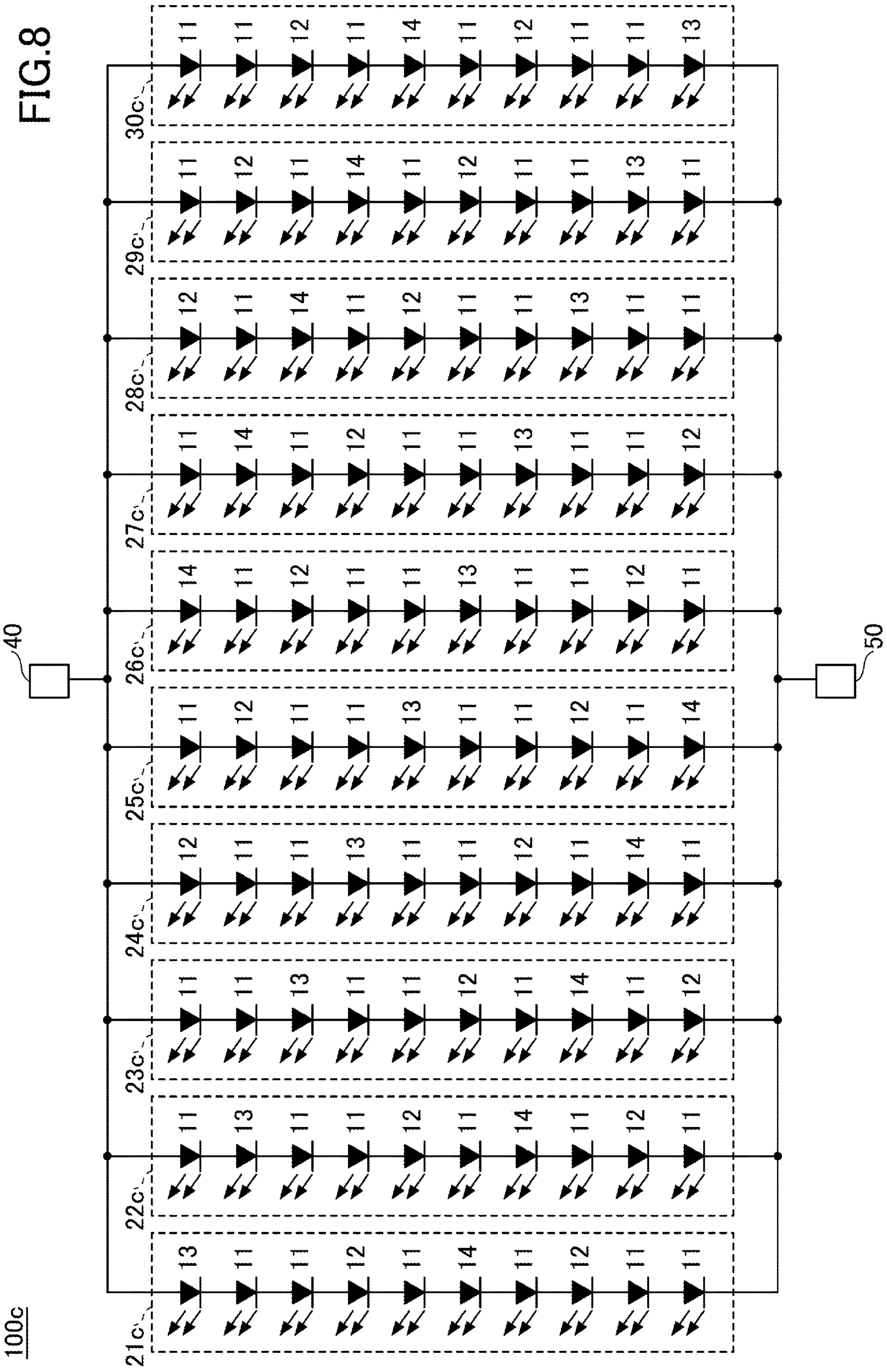
FIG. 8 is a diagram illustrating an example circuit configuration of the light emitting module according to the fourth embodiment.

FIG. 7 is a schematic top view illustrating an example configuration of a light emitting module 100*c* according to the fourth embodiment. FIG. 8 is a diagram illustrating an example circuit configuration of the light emitting module 100*c*.

The light emitting module 100*c* differs from the light emitting module 100 according to the first embodiment in that the light emitting module 100*c* includes a hundred light sources 10*c* arranged in the first direction A and the second direction B and disposed at grid points in a top view as illustrated in FIG. 7 and FIG. 8. In addition, the light emitting module 100*c* differs from the light emitting module 100 in that the light emitting module 100*c* has ten light source arrays 20*c* including light source arrays 21*c* to 30*c*.

Third light sources 13 are aligned on one of two diagonal lines 60 of a grid defined by the hundred light sources in a top view. The two diagonal lines 60 are a first diagonal line 61 and a second diagonal line 62. The third light sources 13 are aligned on the first diagonal line 61. First light sources 11 and second light sources 12 are arranged in a direction parallel to the first diagonal line 61. At least some of the first light sources 11 are disposed between the second light sources 12 and the third light sources 13 as viewed in a direction parallel to the second diagonal line 62.

In the present embodiment, the hundred light sources 10*c* differ from the light sources 10 in that the hundred light sources 10*c* include ten fourth light sources 14 configured to emit light having a fourth peak wavelength that is longer than the second peak wavelength and shorter than the third peak wavelength. In the example illustrated in FIG. 7, the fourth light sources 14 are indicated by cross-hatching. In each of the light source arrays 20*c*, first light sources 11, second light sources 12, a third light source 13, and a fourth light source 14 are connected in series. The output per unit power of the fourth light sources 14 is higher than the output per unit power of the second light sources 12 and lower than the output per unit power of the third light sources 13. The second light sources 12 are arranged on four imaginary lines 70 extending in the direction parallel to the first diagonal line 61. The fourth light sources 14 are arranged in the direction parallel to the first diagonal line 61. The fourth light sources 14 are located between the second light sources 12 as viewed in the direction parallel to the second diagonal line 62. This configuration allows the relatively low output of the second light sources 12 to be maintained while including a large number of peak wavelengths. Accordingly, in the present embodiment, illuminance unevenness in wavelengths in the irradiation region can be reduced while increasing the diversity of emission wavelengths.

In the present embodiment, the first light sources 11 may be arranged on twelve imaginary lines 80 extending in the direction parallel to the first diagonal line 61. Further, the number of first light sources 11 located between the second light sources 12 and the fourth light sources 14 may be smaller than the number of first light sources 11 located between corresponding second light sources 12 and the third light sources 13 as viewed in the direction parallel to the second diagonal line 62. With this configuration, a large number of first light sources 11 having a lower output can be disposed. Accordingly, in the present embodiment, illuminance unevenness in wavelengths in the irradiation region can be reduced while increasing the diversity of emission wavelengths.

Fifth Embodiment

Figure 9:
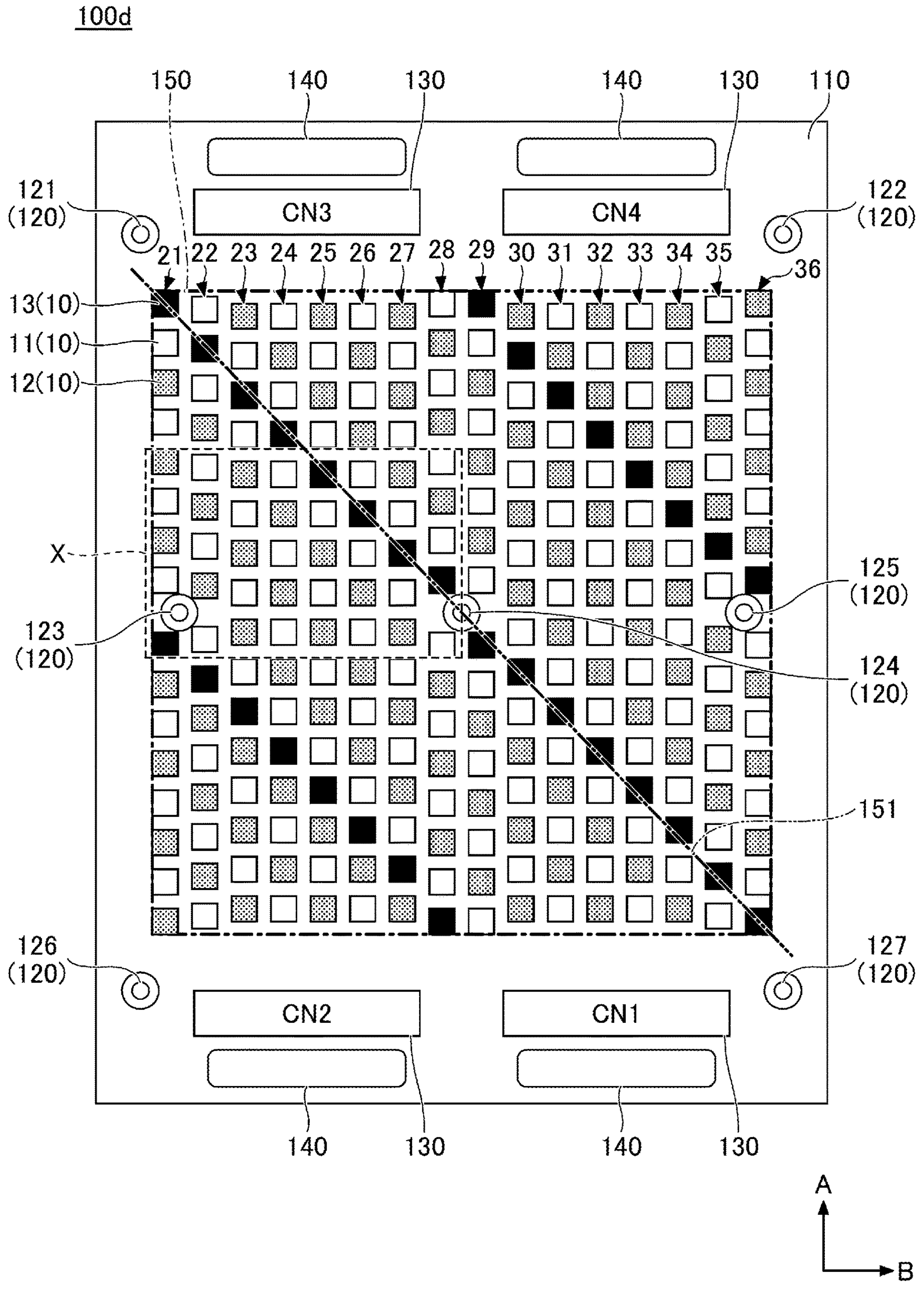
FIG. 9 is a schematic top view illustrating an example configuration of a light emitting module according to a fifth embodiment.
Figure 10:
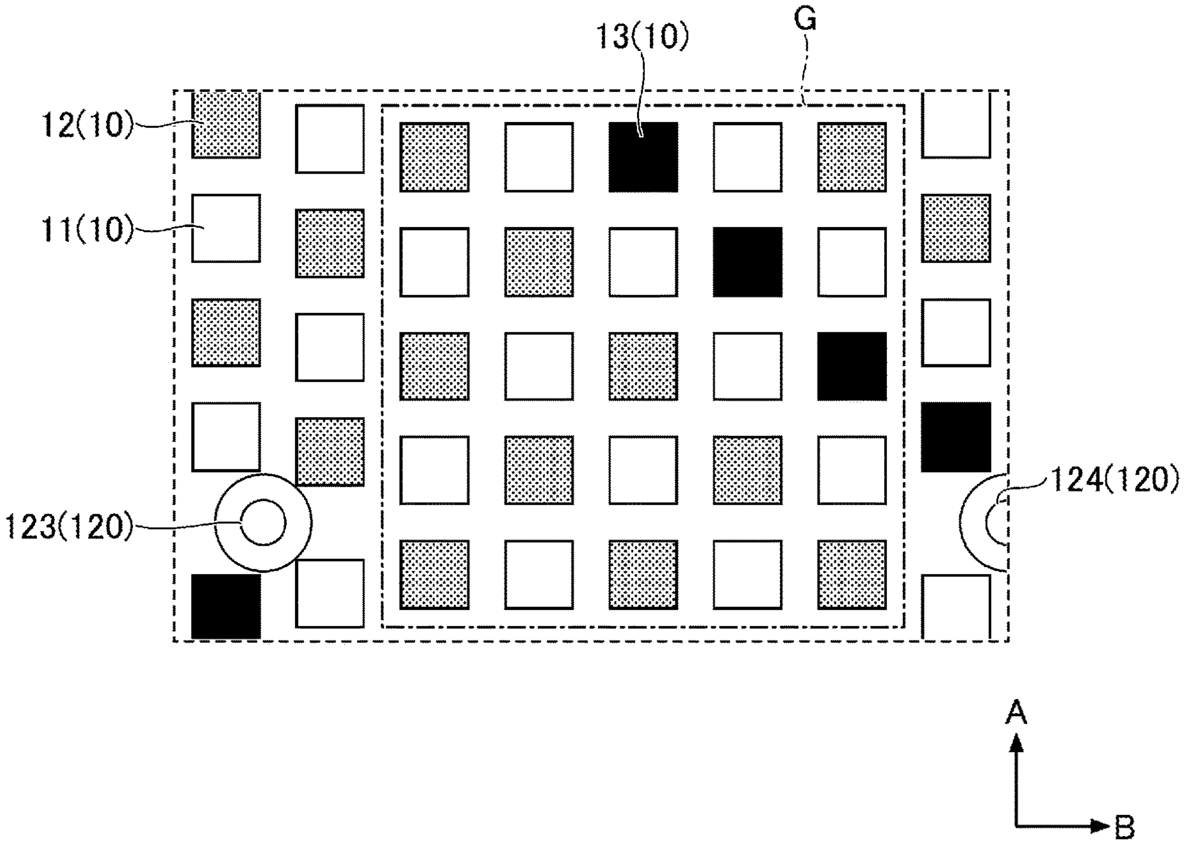
FIG. 10 is an enlarged view of a region X of FIG. 9.

Next, a light emitting module according to a fifth embodiment will be described with reference to FIG. 9 and FIG. 10. FIG. 9 is a schematic top view illustrating an example configuration of a light emitting module 100*d* according to the fifth embodiment. FIG. 10 is an enlarged view of a region X of FIG. 9.

As illustrated in FIG. 9 and FIG. 10, in the present embodiment, a plurality of light sources 10 included in the light emitting module 100*d* are arranged in the first direction A and the second direction B in a top view. Further, some light sources 10, among light sources 10 arranged in the second direction B, are arranged such that the positions in the first direction A of the some light sources 10 are the same. Further, the other light sources 10, among the light sources 10 arranged in the second direction B, are arranged at positions shifted in the first direction A with respect to the above-described some light sources 10 having the same positions in the first direction A in a top view. These are the main points of the fifth embodiment that differ from the first embodiment.

In the example illustrated in FIG. 9, the light emitting module 100*d* includes a wiring substrate 110 on which the plurality of light sources 10 is disposed. The plurality of light sources 10 includes 256 light sources 10. The 256 light sources 10 include first light sources 11, second light sources 12, and third light sources 13. The number of the plurality of light sources 10 can be changed as appropriate. The wiring substrate 110 includes seven fixing portions 120, four connectors 130, and four wiring holes 140. Further, the wiring substrate 110 has a rectangular shape in a top view, and has a placement region 150 where the plurality of light sources 10 are arranged. The outer shape of the placement region 150 is defined by sides parallel to the first direction A and sides parallel to the second direction B, and is a smallest rectangle including all of the plurality of light sources 10.

The seven fixing portions 120 are used to fix the wiring substrate 110 to a member other than the wiring substrate 110. In the example illustrated in FIG. 9, the seven fixing portions 120 include fixing portions 121 to 127. The seven fixing portions 120 include respective screw holes and screw members. In the wiring substrate 110, the screw holes are formed at positions corresponding to the respective fixing portions 120. The wiring substrate 110 can be fixed to the member other than the wiring substrate 110 by the seven screw members disposed in one-to-one correspondence with the seven screw holes.

Wiring is connected to each of the four connectors 130. The wiring electrically connects the wiring substrate 110 and a drive circuit for driving light emission of each of the light sources 10 arranged on the wiring substrate 110. The drive circuit can apply a drive current to each of the light sources 10 via the wiring. The wiring holes 140 are holes through which the wiring connected to each of the connectors 130 passes.

In the wiring substrate 110, there may be a case where all of the light sources 10 are not disposed at grid points along the first direction A and the second direction B, depending on the positions where the fixing portions 120, the connectors 130, the wiring holes 140, and the like are disposed. In the example illustrated in FIG. 9, among a plurality of light source arrays 21 to 36, in each of which light sources 10 are arranged in the first direction A, the fixing portion 123 is disposed in the vicinity of the light source arrays 21 and 22, the fixing portion 124 is disposed in the vicinity of the light source arrays 28 and 29, and the fixing portion 125 is disposed in the vicinity of the light source arrays 35 and 36. In order to securely fix the central portion of the wiring substrate 110 to another member such as a heat sink, the positions of the fixing portion 123 and the fixing portion 125 in the second direction B are shifted toward the center of the wiring substrate 110 with respect to the four fixing portions 121, 122, 126, and 127 that are disposed outside the placement region 150 described later. Light sources arranged in each of the light source arrays 21 and 22, the light source arrays 28 and 29, and the light source arrays 35 and 36 are disposed at positions shifted with respect to grid points of the light source arrays 23 to 27 and the light source arrays 30 to 34 so as not to interfere with the fixing portions 123 to 125.

In another aspect, in the example illustrated in FIG. 10, some light sources 10 located in a region G, among light sources 10 arranged in the second direction B, are arranged such that the positions in the first direction A of the some light sources are the same in a top view. Conversely, the other light sources 10 located in a region other than the region G, among the light sources 10 arranged in the second direction B, are arranged at positions shifted in the first direction A with respect to the above-described some light sources 10 in a top view so as not to interfere with the fixing portion 123 and the fixing portion 124.

As described above, in the present embodiment, some light sources 10, among light sources 10 arranged in the second direction B, are arranged such that the positions in the first direction A of the some light sources are the same in a top view. Further, the other light sources 10, among the light sources 10 arranged in the second direction B, are arranged at positions shifted in the first direction A with respect to the above-described some light sources 10 having the same positions in the first direction A in a top view. Accordingly, in the wiring substrate 110, the other light sources 10, among the light sources 10 arranged in the second direction, can be arranged so as not to interfere with other members such as the fixing portions 120, the connectors 130, and the wiring holes 140.

In the example illustrated in FIG. 10, the diameter of the fixing portion 123 is 1.0 times or more and 3.0 times or less the interval between two adjacent light sources 10 located in the region G. The magnitude of the shift of each light source 10 located in the region other than the region G with respect to each light source 10 located in the region G is 100% or less of the width of the light sources 10. In the light emitting module **100*d*, the number of light sources 10 included in one light source array 20 is the same for each of the light source arrays 21 to 36. In the light emitting module 100*d*, as long as some light sources 10, among light sources 10 arranged in the second direction B, are arranged such that the positions in the first direction A of the some light sources are the same in a top view, the other light sources 10, among the light sources 10 arranged in the second direction B, are not required to be arranged such that the positions in the first direction A of the other light sources 10 are the same in a top view. In addition, the other light sources 10 may be arranged at positions shifted in a direction different from the first direction A and the second direction B. Further, the other light sources 10 may be shifted in the same direction, or at least some of the other light sources 10** may be shifted in different directions.

Further, in the example illustrated in FIG. 9, some of the third light sources 13 are located on a diagonal line 151 of the placement region 150 having a rectangular shape in a top view. By causing the number of the third light sources 13 having a high output to be smaller than the number of the first light sources 11 and the number of the second light sources 12, and causing the some of the third light sources 13 to be located on the diagonal line 151 of the placement region 150, output imbalances in the light emitting module **100*d* are easily reduced. Accordingly, the light emitting module 100*d*** can reduce illuminance unevenness in the irradiation region.

Sixth Embodiment

Figure 11:
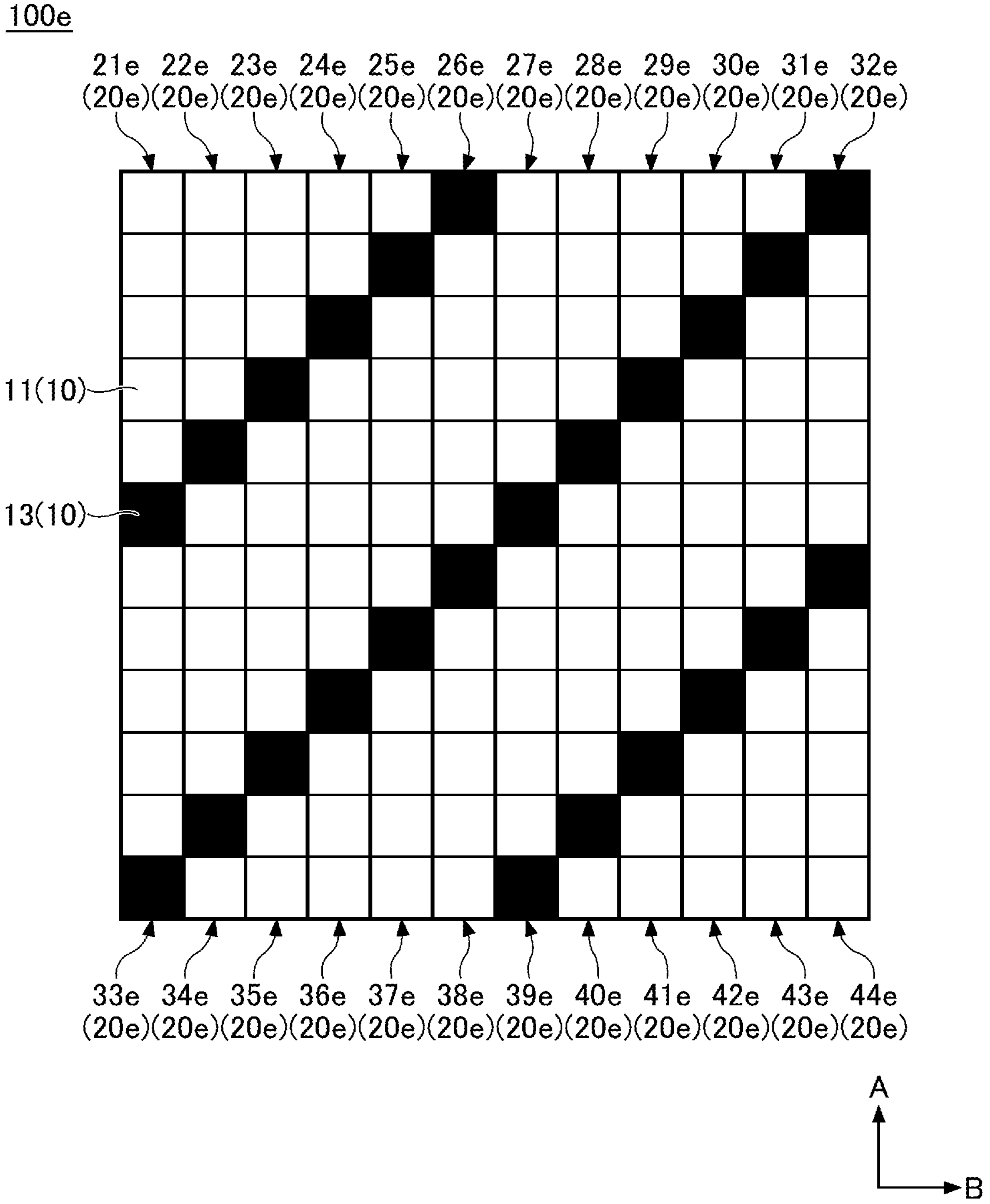
FIG. 11 is a schematic top view illustrating an example configuration of a light emitting module according to a sixth embodiment.
Figure 12:
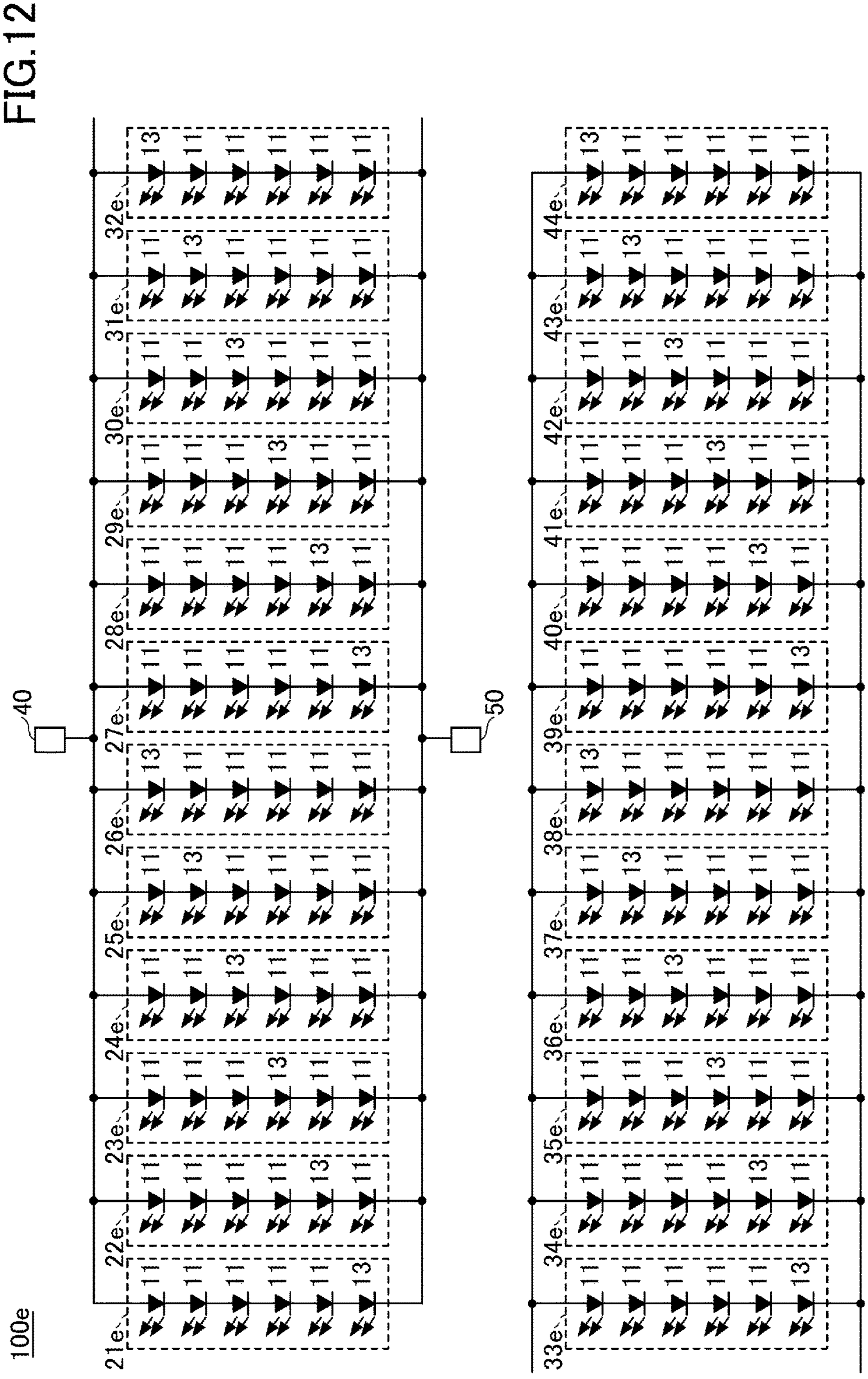
FIG. 12 is a diagram illustrating an example circuit configuration of the light emitting module according to the sixth embodiment.

Next, a light emitting module according to a sixth embodiment will be described with reference to FIG. 11 and FIG. 12. FIG. 11 is a schematic top view illustrating an example configuration of a light emitting module **100*e* according to the sixth embodiment. FIG. 12 is a diagram illustrating an example circuit configuration of the light emitting module 100*e***.

The light emitting module **100*e* according to the sixth embodiment differs from the first embodiment in that the light emitting module 100*e* does not include any second light sources 12**.

In the example illustrated in FIG. 11, the light emitting module **100*e* includes 144 light sources 10, serving as a plurality of light sources 10, arranged in the first direction A and the second direction B orthogonal to the first direction A in a top view. The 144 light sources 10 (plurality of light sources 10) are arranged in light source arrays 20*e* and includes a plurality of first light sources 11 configured to emit light having a first peak wavelength and a plurality of third light sources 13 configured to emit light having a third peak wavelength longer than the first peak wavelength. In each of the light source arrays 20*e*, two or more first light sources 11 and one or more third light sources 13 are arranged in the first direction A and connected in series. The number of the first light sources 11 included in the plurality of light sources 10 is greater than the number of the third light sources 13 included in the plurality of light sources 10. The output per unit power of the third light sources 13 is higher than the output per unit power of the first light sources 11. At least some of the first light sources 11 are disposed at positions adjacent to the third light sources 13** in the first direction A and the second direction B.

In the example illustrated in FIG. 11 and FIG. 12, the 144 light sources 10 are arranged in twelve light source arrays **20*e*. In the example illustrated in FIG. 12, the twelve light source arrays 20*e* include light source arrays 21*e* to 32*e*. The light source arrays 21*e* to 32*e* are connected in parallel between an anode-side electrode (positive-side electrode) 40 and a cathode-side electrode (negative-side electrode) 50. In each of the light source arrays 21*e* to 32*e*, five first light sources 11 and one third light source 13** are arranged in the first direction A and connected in series.

In the light emitting module **100*e*, the number of the first light sources 11, whose output per unit power is lower than that of the third light sources 13, is greater than the number of the third light sources 13. Accordingly, the illuminance of the light having the first peak wavelength and the illuminance of the light having the third peak wavelength can be made to be close to each other. In addition, at least some of the first light sources 11 are disposed at positions adjacent to the third light sources 13 in the first direction A and the second direction B. That is, the third light sources 13 having a high output per unit power are not disposed adjacent to each other in the first direction A and the second direction B. Thus, illuminance distribution unevenness in wavelengths of the light emitting module 100*e* in a top view are easily reduced. Accordingly, in the present embodiment, the light emitting module 100*e*** that can reduce illuminance unevenness in the irradiation region can be provided.

Further, in the light emitting module **100*e*, the plurality of light sources 10** can be disposed at grid points along the first direction A and the second direction B in a top view.

Accordingly, illuminance unevenness in the irradiation region can be reduced.

Seventh Embodiment

Figure 13:
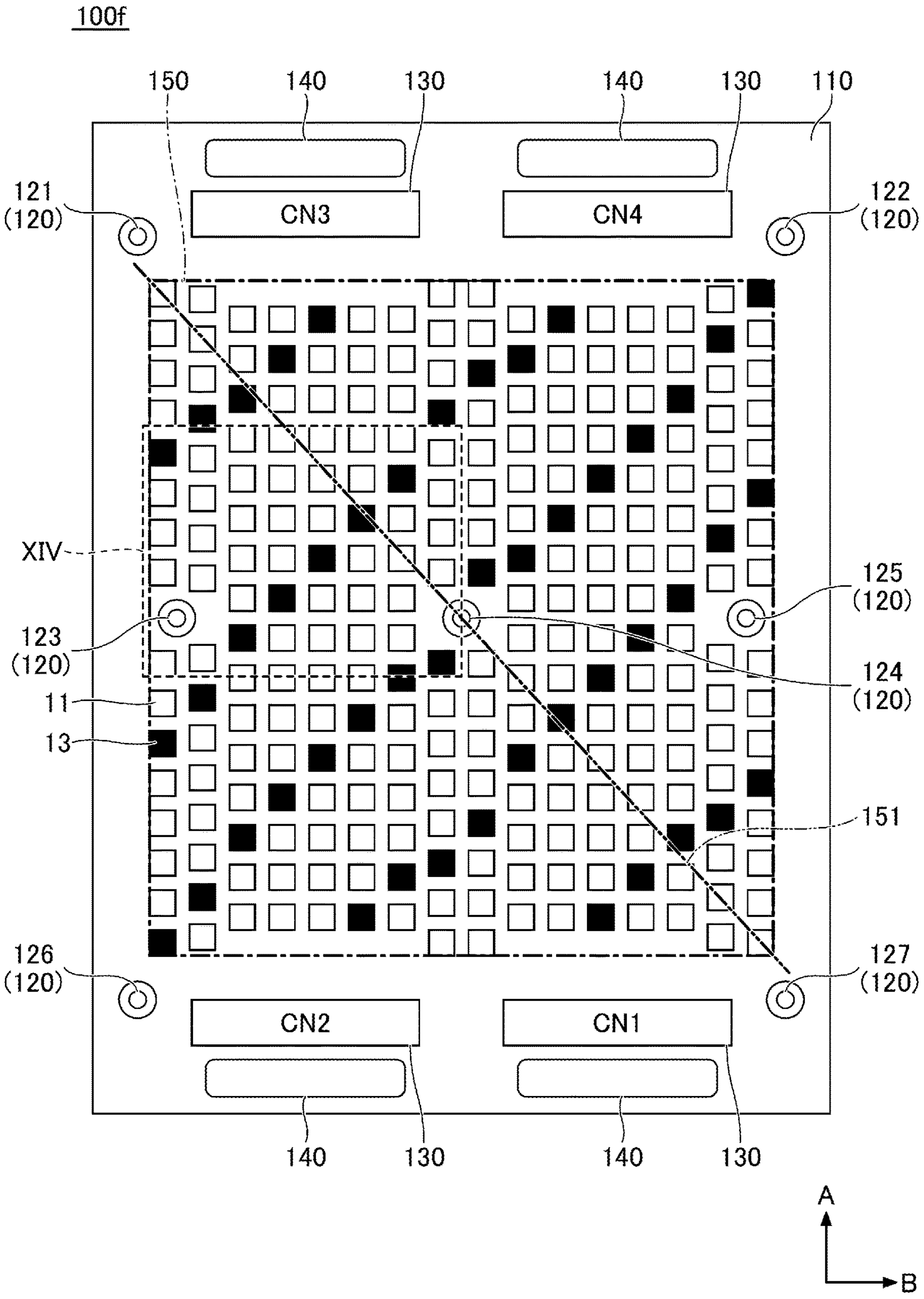
FIG. 13 is a schematic top view illustrating an example configuration of a light emitting module according to a seventh embodiment.
Figure 14:
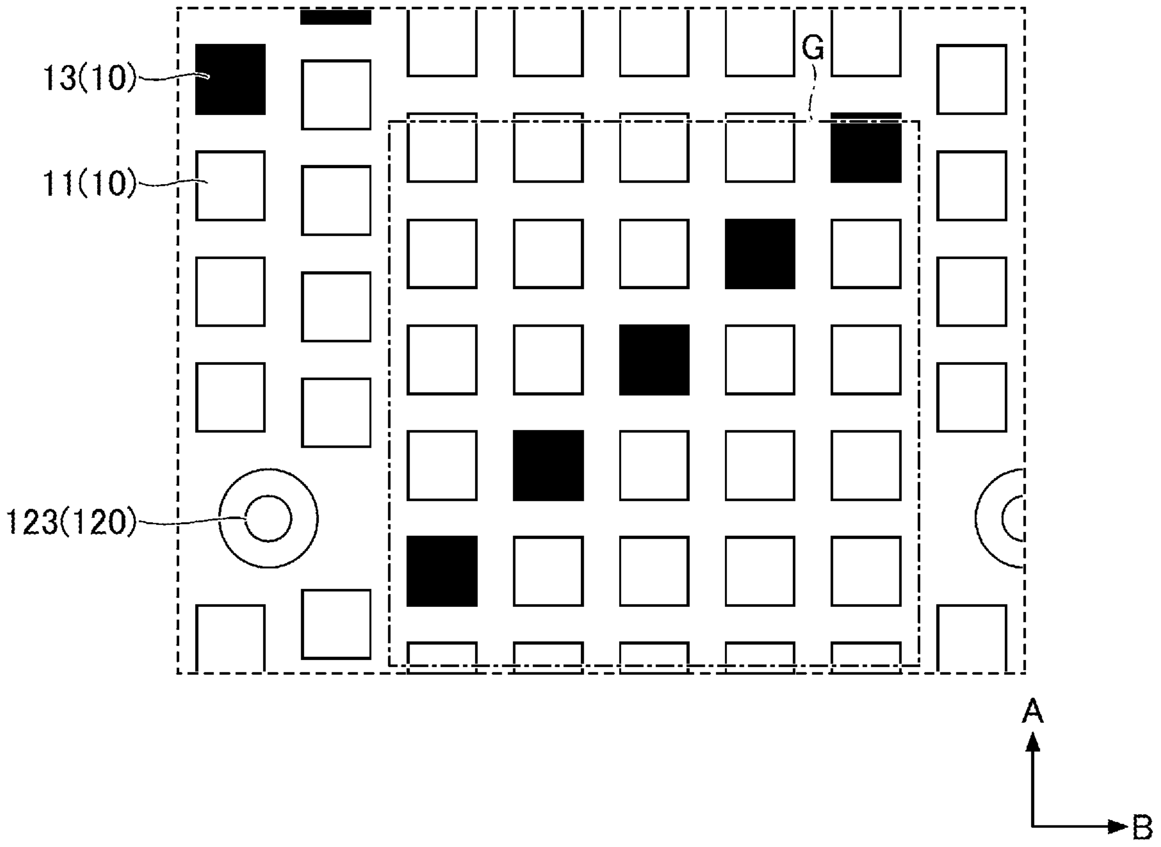
FIG. 14 is a diagram illustrating an enlarged view of a region XIV of FIG. 13.

Next, a light emitting module according to a seventh embodiment will be described with reference to FIG. 13 and FIG. 14. FIG. 13 is a schematic top view illustrating an example configuration of a light emitting module **100*f* according to the seventh embodiment. FIG. 14 is a diagram illustrating an enlarged view of a region XIV of FIG. 13**.

The light emitting module **100*f* according to the present embodiment differs from the fifth embodiment in that the light emitting module 100*f* does not include any second light sources 12**.

As illustrated in FIG. 13 and FIG. 14, in the present embodiment, a plurality of light sources 10 included in the light emitting module **100*f* are arranged in the first direction A and the second direction B in a top view. Some light sources 10, among light sources 10** arranged in the second direction B, are arranged such that the positions in the first direction A of the some light sources are the same in a top view.

In the preset embodiment, some light sources 10, among light sources 10 arranged in the second direction B, are arranged such that the positions in the first direction A of the some light sources are the same in a top view. The other light sources 10, among the light sources 10 arranged in the second direction, B are arranged at positions shifted in the first direction A with respect to the above-described some light sources 10 having the same positions in the first direction A in a top view. Accordingly, the other light sources 10 among the light sources 10 arranged in the second direction B can be arranged so as not to interfere with other members such as the fixing portions 120, the connectors 130, and the wiring holes 140. As a result, in the present embodiment, the plurality of light sources 10 can be disposed on the wiring substrate 110 so as not to interfere with other members such as the fixing portions 120, the connectors 130, and the wiring holes 140.

Further, in the example illustrated in FIG. 13, some of the third light sources 13 are located on a diagonal line 151 of the placement region 150 having a rectangular shape in a top view. By causing the number of the third light sources 13 having a high output to be smaller than the number of the first light sources 11, and causing the some of the third light sources 13 to be located on the diagonal line 151 of the placement region 150, output imbalances in the light emitting module **100*f* are easily reduced. Accordingly, the light emitting module 100*f*** can reduce illuminance unevenness in wavelengths in the irradiation region.

Although the embodiments have been described in detail above, the present disclosure is not limited to the above-described embodiments, and various modifications and substitutions can be made to the above-described embodiments without departing from the scope recited in the claims.

The numbers such as ordinal numbers and quantities used in the description of the embodiments are all exemplified to specifically describe the technique of the present disclosure, and the present disclosure is not limited to the exemplified numbers. In addition, the connection relationship between the components is illustrated for specifically describing the technique of the present disclosure, and the connection relationship for implementing the functions of the present disclosure is not limited thereto.

The light emitting modules according to the present disclosure can emit light such that illuminance unevenness is reduced in the irradiation region. Therefore, the light emitting modules according to the present disclosure can be suitably used in applications such as printing and exposure in which an object is irradiated with light such as ultraviolet light in order to cure the object. However, the application of the light emitting modules according to the present disclosure is not limited to these applications.

According to an embodiment of the present disclosure, a light emitting module that can reduce illuminance unevenness in an irradiation region can be provided.

What is claimed is:

1. A light emitting module, comprising:

a plurality of light sources arranged in a first direction and a second direction and disposed at grid points in a top view, wherein the second direction is orthogonal to the first direction, the plurality of light sources are arranged in a plurality of light source arrays and include a plurality of first light sources configured to emit light having a first peak wavelength, a plurality of second light sources configured to emit light having a second peak wavelength longer than the first peak wavelength, and a plurality of third light sources configured to emit light having a third peak wavelength longer than the second peak wavelength, in each of the light source arrays, two or more first light sources, two or more second light sources, and one or more third light sources are arranged in the first direction and connected in series, a number of the plurality of first light sources included in the plurality of light sources is greater than a number of the plurality of second light sources included in the plurality of light sources, the number of the plurality of second light sources included in the plurality of light sources is greater than a number of the plurality of third light sources included in the plurality of light sources, an output per unit power of the plurality of third light sources is higher than an output per unit power of the plurality of second light sources, the output per unit power of the plurality of second light sources is higher than an output per unit power of the plurality of first light sources, and at least some of the plurality of first light sources or at least some of the plurality of second light sources are disposed at positions adjacent to the plurality of third light sources in the first direction and the second direction.

2. The light emitting module according to claim 1, wherein the at least some of the plurality of first light sources are disposed at the positions adjacent to the plurality of third light sources in the first direction and the second direction.

3. The light emitting module according to claim 2, wherein at least another some of the plurality of first light sources are disposed at positions adjacent to the plurality of second light sources in the first direction and the second direction.

4. The light emitting module according to claim 1, wherein the plurality of third light sources are aligned on one of two diagonal lines of a grid defined by the plurality of light sources in the top view.

5. The light emitting module according to claim 4, wherein the two diagonal lines are a first diagonal line and a second diagonal line, the plurality of third light sources is aligned on the first diagonal line, the plurality of first light sources and the plurality of second light sources are arranged in a direction parallel to the first diagonal line, and at least another some of the plurality of first light sources are located between corresponding second light sources and the third light sources in one or both of the first direction and the second direction.

6. The light emitting module according to claim 5, wherein the plurality of light sources further includes a plurality of fourth light sources configured to emit light having a fourth peak wavelength that is longer than the second peak wavelength and shorter than the third peak wavelength, in each of the light source arrays, one or more fourth light sources are further connected in series, an output per unit power of the plurality of fourth light sources is higher than the output per unit power of the plurality of second light sources and is lower than the output per unit power of the plurality of third light sources, the plurality of second light sources are arranged on a plurality of imaginary lines extending in the direction parallel to the first diagonal line, and the plurality of fourth light sources are arranged in the direction parallel to the first diagonal line, and are located between the plurality of second light sources as viewed in a direction parallel to the second diagonal line.

7. The light emitting module according to claim 6, wherein the plurality of first light sources are arranged on a plurality of imaginary lines extending in the direction parallel to the first diagonal line, and a number of first light sources located between the plurality of second light sources and the plurality of fourth light sources is smaller than a number of first light sources located between corresponding second light sources and the third light source as viewed in the direction parallel to the second diagonal line.

8. The light emitting module according to claim 1, wherein a number of the two or more first light sources in each of the light source arrays are the same, a number of the two or more second light sources in each of the light source arrays are the same, and a number of the one or more third light sources in each of the light source arrays are the same.

9. The light emitting module according to claim 1, wherein a difference between the first peak wavelength and the second peak wavelength is smaller than a difference between the second peak wavelength and the third peak wavelength.

10. A light emitting module, comprising:

a plurality of light sources arranged in a first direction and a second direction in a top view, wherein the second direction is orthogonal to the first direction, the plurality of light sources are arranged in a plurality of light source arrays and include a plurality of first light sources configured to emit light having a first peak wavelength, a plurality of second light sources configured to emit light having a second peak wavelength longer than the first peak wavelength, and a plurality of third light sources configured to emit light having a third peak wavelength longer than the second peak wavelength, in each of the light source arrays, two or more first light sources, two or more second light sources, and one or more third light sources are arranged in the first direction and connected in series, a number of the plurality of first light sources included in the plurality of light sources is greater than a number of the plurality of second light sources included in the plurality of light sources, the number of the plurality of second light sources included in the plurality of light sources is greater than a number of the plurality of third light sources included in the plurality of light sources, an output per unit power of the plurality of third light sources is higher than an output per unit power of the plurality of second light sources, the output per unit power of the plurality of second light sources is higher than an output per unit power of the plurality of first light sources, at least some of the plurality of first light sources or at least some of the plurality of second light sources are disposed at positions adjacent to the plurality of third light sources in the first direction and the second direction, and some light sources, among light sources arranged in the second direction, are arranged such that positions in the first direction of the some light sources are the same in the top view.

11. The light emitting module according to claim 10, wherein other light sources, among the light sources arranged in the second direction, are arranged at positions shifted in the first direction with respect to the some light sources having the same positions in the first direction in the top view.

12. The light emitting module according to claim 10, further comprising a wiring substrate on which the plurality of light sources are disposed, wherein the wiring substrate has a placement region where the plurality of light sources are arranged, and an outer shape of the placement region is defined by sides parallel to the first direction and sides parallel to the second direction, and is a smallest rectangle including all of the plurality of light sources.

13. A light emitting module, comprising:

a plurality of light sources arranged in a first direction and a second direction in a top view, wherein the second direction is orthogonal to the first direction, the plurality of light sources are arranged in a plurality of light source arrays and include a plurality of first light sources configured to emit light having a first peak wavelength, and a plurality of third light sources configured to emit light having a third peak wavelength longer than the first peak wavelength, in each of the light source arrays, two or more first light sources and one or more third light sources are arranged in the first direction and connected in series, a number of the plurality of first light sources included in the plurality of light sources is greater than a number of the plurality of third light sources included in the plurality of light sources, an output per unit power of the plurality of third light sources is higher than an output per unit power of the plurality of first light sources, and at least some of the plurality of first light sources are disposed at positions adjacent to the plurality of third light sources in the first direction and the second direction, some light sources, among light sources arranged in the second direction, are arranged such that positions in the first direction of the some light sources are the same in the top view, and other light sources, among the light sources arranged in the second direction, are disposed at positions shifted in the first direction with respect to the some light sources having the same positions in the first direction in the top view.

14. The light emitting module according to claim 13, wherein the plurality of light sources are disposed at grid points along the first direction and the second direction in the top view.

15. The light emitting module according to claim 13, further comprising a wiring substrate on which the plurality of light sources are disposed, wherein the wiring substrate has a placement region where the plurality of light sources are arranged, an outer shape of the placement region is defined by sides parallel to the first direction and sides parallel to the second direction, and is a smallest rectangle including all of the plurality of light sources, and some of the plurality of third light sources are disposed on a diagonal line of the placement region.

* * * * *